(12) United States Patent
Shaeffer et al.

(10) Patent No.: US 9,336,834 B2
(45) Date of Patent: May 10, 2016

(54) OFFSETTING CLOCK PACKAGE PINS IN A CLAMSHELL TOPOLOGY TO IMPROVE SIGNAL INTEGRITY

(75) Inventors: Ian Shaeffer, Los Gatos, CA (US); Ravindranath Kollipara, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/983,998

(22) PCT Filed: Feb. 7, 2012

(86) PCT No.: PCT/US2012/024066
§ 371 (c)(1),
(2), (4) Date: Aug. 6, 2013

(87) PCT Pub. No.: WO2012/109185
PCT Pub. Date: Aug. 16, 2012

(65) Prior Publication Data
US 2013/0314968 A1  Nov. 28, 2013

Related U.S. Application Data

(60) Provisional application No. 61/441,221, filed on Feb. 9, 2011.

(51) Int. Cl.
*G11C 5/02* (2006.01)
*H01L 23/48* (2006.01)
*G11C 5/04* (2006.01)
(Continued)

(52) U.S. Cl.
CPC .. *G11C 5/02* (2013.01); *G11C 5/04* (2013.01); *G11C 5/06* (2013.01); *H01L 23/48* (2013.01); *H01L 25/105* (2013.01); *H01L 23/3128* (2013.01); *H01L 24/73* (2013.01); *H01L 2224/32225* (2013.01); *H01L 2224/4824* (2013.01); *H01L 2224/73215* (2013.01); *H01L 2924/00013* (2013.01); *H05K 1/181* (2013.01); *H05K 2201/10159* (2013.01)

(58) Field of Classification Search
None
See application file for complete search history.

(56) References Cited

U.S. PATENT DOCUMENTS 6,839,266 B1  1/2005  Ware et al.
7,644,250 B2 *  1/2010  Zimmerman et al. ........ 711/170
(Continued)

OTHER PUBLICATIONS

PCT International Preliminary Report on Patentability dated Aug. 22, 2013 (Chapter I) in International Application No. PCT/US2012/024066. 7 pages.

*Primary Examiner* — James G Norman
(74) *Attorney, Agent, or Firm* — Lance Kreisman; Peninsula Patent Group

(57) ABSTRACT

The disclosed embodiments relate to the design of a memory system which includes a set of one or more memory modules, wherein each memory module in the set has a clamshell configuration, wherein pairs of opposing memory packages containing memory chips are located on opposite sides of the memory module. The memory system also includes a multi-drop path containing signal lines which pass through the set of memory modules, and are coupled to memory packages in the set of memory modules. For a given signal line in the multi-drop path, a first memory package and a second memory package that comprise a given pair of opposing memory packages are coupled to the given signal line at a first location and a second location, respectively, wherein the first location and the second location are separated from each other by a distance d1 along the given signal line.

13 Claims, 8 Drawing Sheets

(51) Int. Cl.
  *G11C 5/06*  (2006.01)
  *H01L 25/10*  (2006.01)
  *H01L 23/31*  (2006.01)
  *H01L 23/00*  (2006.01)
  *H05K 1/18*  (2006.01)

(56) References Cited

U.S. PATENT DOCUMENTS

| | | | |
|---|---|---|---|
| 7,814,239 B2 * | 10/2010 | Kim et al. | 710/14 |
| 8,598,908 B1 * | 12/2013 | Sullam et al. | 326/41 |
| 2005/0195629 A1 * | 9/2005 | Leddige | G11C 5/02 365/51 |
| 2006/0023482 A1 | 2/2006 | Dreps et al. | |
| 2006/0184756 A1 | 8/2006 | Djordjevic et al. | |
| 2007/0019494 A1 | 1/2007 | Moosrainer et al. | |
| 2007/0047344 A1 | 3/2007 | Thayer et al. | |
| 2008/0062734 A1 | 3/2008 | Leddige et al. | |
| 2009/0154211 A1 | 6/2009 | Qu et al. | |
| 2010/0046266 A1 | 2/2010 | Bruennert et al. | |
| 2010/0062621 A1 | 3/2010 | Bruennert et al. | |

* cited by examiner

US 9,336,834 B2

OFFSETTING CLOCK PACKAGE PINS IN A CLAMSHELL TOPOLOGY TO IMPROVE SIGNAL INTEGRITY

CROSS-REFERENCE TO RELATED APPLICATIONS/TECHNICAL FIELD

Pursuant to 35 U.S.C. §365, this application claims priority from International Application No. PCT/US2012/024066, published as WO 2012/109185 A2 on Aug. 16, 2012, which claims priority from U.S. Provisional Application No. 61/441,221, filed Feb. 9, 2011 and entitled "OFFSETTING CLOCK PACKAGE PINS IN A CLAMSHELL TOPOLOGY TO IMPROVE SIGNAL INTEGRITY". International Application No. PCT/US2012/024066 and U.S. Provisional Application No. 61/441,221 are hereby incorporated by reference in their entirety.

BACKGROUND

1. Field

The disclosed embodiments relate to the design of memories for computer systems. More specifically, the disclosed embodiments relate to a technique for offsetting clock package pins in a clamshell memory topology to improve signal integrity.

2. Related Art

Modern memory systems often provide separate pathways for command/address signals and data signals. For example, some memory systems provide a multi-drop "fly-by path" to rout command/address signals from a memory controller through multiple memory devices, and a separate "direct path" to communicate data signals directly between the memory controller and the memory devices. Some memory systems that provide a fly-by path have a "clamshell" configuration, wherein pairs of memory packages containing memory chips are located on opposite sides of each memory module.

In such clamshell fly-by topologies, the two memory packages that comprise a given pair of opposing memory packages typically tap into a signal line on the fly-by path (such as a clock line) at a single shared location, which is located toward the center of the memory packages. Moreover, the package pins used to carry such signals are typically also located toward the center of the memory packages to reduce associated stub lengths within the memory packages. However, tapping into a signal line at a single shared location effectively places a double load on the signal line at the shared location. This double-load can worsen reflections that increase attenuation at high frequencies, and these reflections can be problematic for high-speed clock signals used for data timing.

Hence, what is needed is a method and an apparatus for reducing such reflections in signal lines in clamshell fly-by topologies.

DETAILED DESCRIPTION

The disclosed embodiments generally relate to techniques for improving performance in high-speed memory systems. More specifically, the disclosed embodiments relate to a technique for reducing the attenuation of high-speed signals (such as clock signals) on a fly-by path in a clamshell fly-by memory topology. More specifically, the attenuation of such high-speed signals can be reduced by separating pairs of clamshell loads so that the loads are more distributed along fly-by signal lines. This can be accomplished by moving the pins for each pair of clamshell loads in different directions on the fly-by path toward distal edges of their respective memory packages. When this is done, signal connections for pairs of clamshell memory chips are maximally separated on associated fly-by signal lines, while the separations between pins carrying other lower-speed signals on the fly-by path are minimized (which facilitates reducing associated memory package stub lengths). Note that the term "memory package" in the disclosure and appended claims can refer to any type of packaging (e.g., plastic or ceramic) that surrounds a semiconductor chip. The term "memory package" can also refer to a "flip chip" that includes solder bumps on the top surface of the chip, which enables the chip to bond to external circuitry when the chip is oriented face down.

Before describing this technique in more detail, we first describe structural features of a computer system that uses this technique.

Computer System

Figure 1:
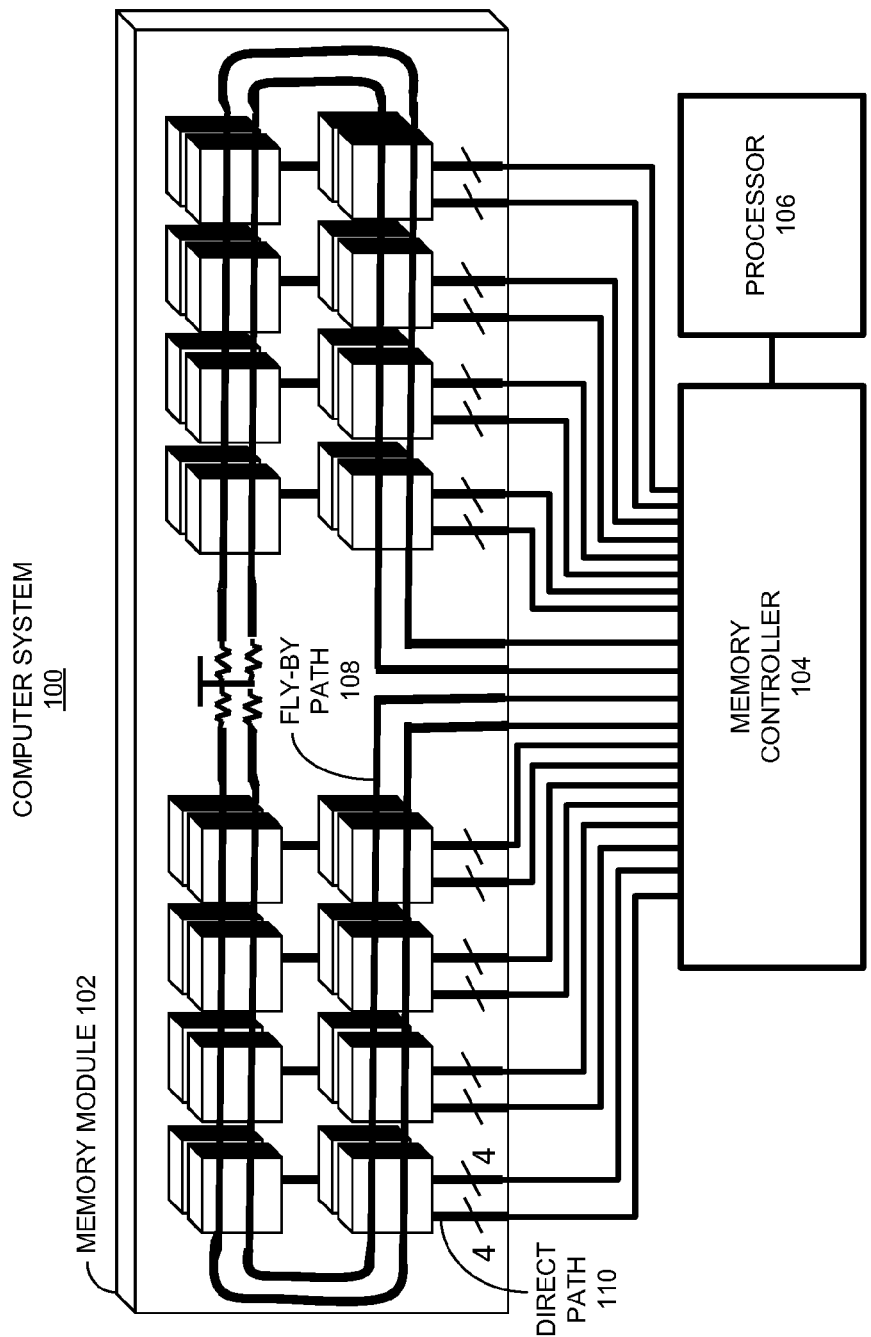
FIG. 1 illustrates a computer system in accordance with the disclosed embodiments.

FIG. 1 illustrates a computer system 100 in accordance with the disclosed embodiments. Computer system 100 can generally include any type of computer system or computing device, including, but not limited to, a computer system based on a microprocessor, a mainframe computer, a digital signal processor, a portable computing device, a personal digital assistant, a cell phone, a device controller, or a computational engine within an appliance.

Computer system 100 includes a processor 106, which operates on code and data accessed from a memory system, which includes memory controller 104 and memory module 102. Processor 106 can generally include any type of single-core or multi-core processor. Moreover, memory controller 104 can generally include any type of circuitry for controlling accesses to memory chips located on one or more memory modules, such as memory module 102. Memory controller 104 can alternatively be incorporated into a functional unit within processor 106 itself. Note that although only a single memory module 102 is illustrated in FIG. 1, computer system 100 can generally include multiple memory modules.

As illustrated in FIG. 1, memory module 102 has a clamshell design, wherein pairs of opposing memory packages are located on opposite sides of a circuit board. Moreover, memory module 102 supports a fly-by topology, wherein command and address signals from memory controller 104 are communicated to the memory chips through a number of fly-by paths including fly-by path 108. At the same time, data signals are communicated directly between memory controller 104 and the memory chips through a number of direct paths between the memory controller and the memory chips, including direct path 110.

Memory Module

Figure 2:
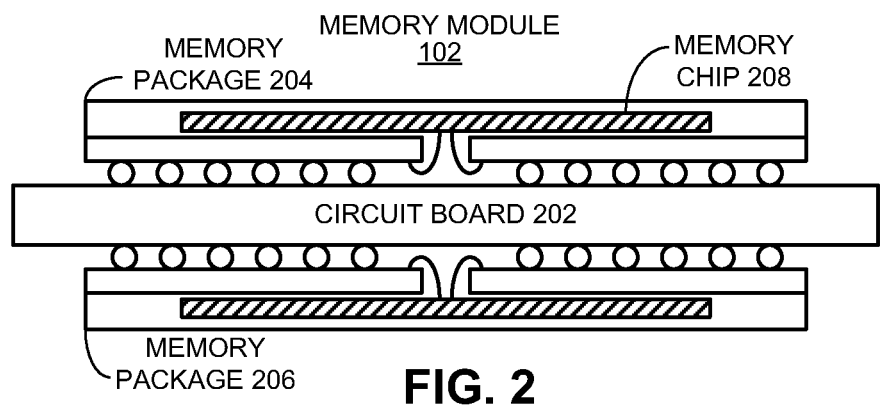
FIG. 2 illustrates a cross-sectional view of a memory module in accordance with the disclosed embodiments.

FIG. 2 illustrates a cross-sectional view of memory module 102 in accordance with the disclosed embodiments. Memory module 102 includes a circuit board 202, which for example can be located in the chassis of a computer system. As mentioned above, memory module 102 has a clamshell configuration in which pairs of memory packages are mounted on opposite sides of circuit board 202. For example, in FIG. 2 memory packages 204 and 206 are mounted on opposite sides of circuit board 202. Note that memory packages 204 and 206 are electrically coupled to traces (not shown) within circuit board 202 through a number of solder ball connections. Each memory package includes one or more memory chips. For example in FIG. 2, memory package 204 includes memory chip 208. As is illustrated in FIG. 2, the memory chips are electrically coupled to their respective chip packages through center I/Os on the memory chips. Note that different types of memory devices may be used in memory module 102, for example, memory devices adhering to double data rate (DDR) standards, such as DDR2, DDR3, and DDR4, and future generations of memory devices, such as GDDR5, XDR, Mobile XDR, LPDDR, and LPDDR2. Also, other types of non-DDR clocked memory devices can be used.

Load Spreading

Figure 3:
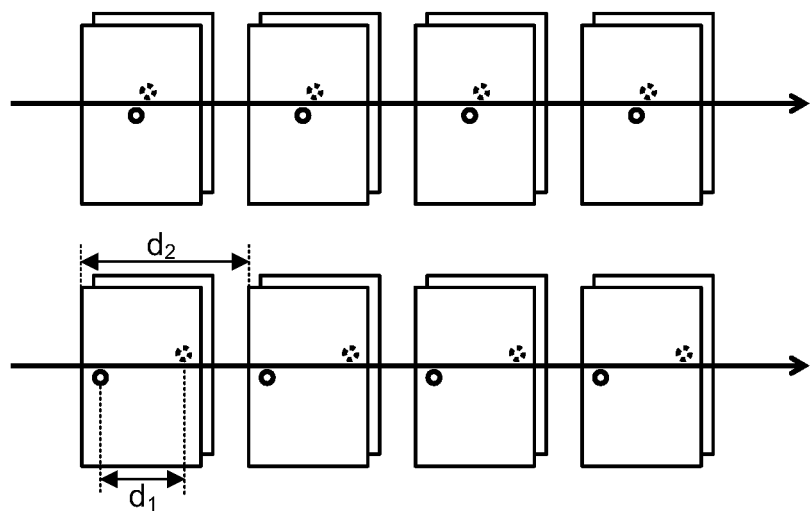
FIG. 3 illustrates a technique for spreading a load on a signal line in a clamshell fly-by topology in accordance with the disclosed embodiments.

FIG. 3 illustrates a technique for spreading a load across a signal line in a clamshell fly-by topology in accordance with the disclosed embodiments. The top portion of FIG. 3 illustrates a conventional clamshell fly topology, wherein a signal line in a fly-by path passes through four pairs of opposing memory packages. Associated signals from the chips that comprise each pair tap into this signal line at the same shared location which is proximate to the centers of each of the memory chips. (These taps are illustrated as solid and dashed circles, with the solid circles illustrating taps from the front-side memory packages and the dashed circles illustrating taps from the back-side memory packages.) Note that the connections from each chip are located as close as possible to the centers of the memory chips to reduce stub lengths in the memory chip packages. Also note that the connections from the chips feed through vias within the memory module circuit board and ultimately connect to the signal line at a single shared location in the circuit board.

In contrast, the bottom portion of FIG. 3 illustrates how the associated connections from the pairs of chips can alternatively connect with the signal line at two separate locations. This effectively spreads out the load for these connections across the signal line, which in turn can improve performance for high-frequency signals, such as clock signals, on the fly-by path. In an ideal configuration, the distance $d_1$ between connections for corresponding signal lines from pairs of chips is substantially half of a spacing $d_2$ between successive pairs of memory packages along the given signal line. In this way, the load can be spread out along the signal line to improve signal integrity at high frequencies.

Pin Layout

Figure 4:
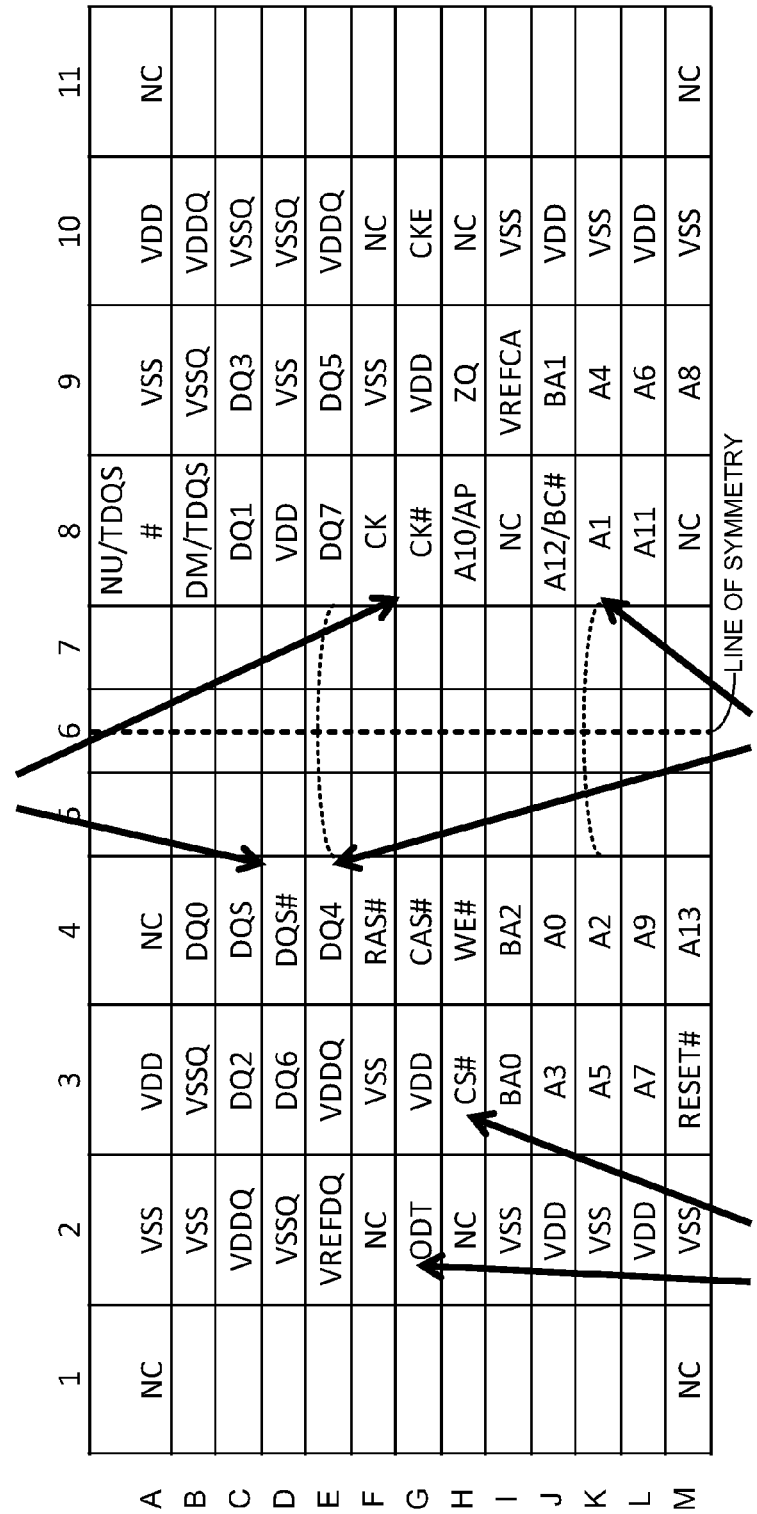
FIG. 4 illustrates an exemplary pin layout for a memory package in accordance with the disclosed embodiments.

FIG. 4 illustrates an exemplary DDR3 pin layout for a memory package in accordance with the disclosed embodiments. Note that possible pin locations near the center of the memory package do not contain pins because the space is consumed by wiring that connects center I/Os from the memory chip with the memory package. (This wiring is illustrated in the cross-sectional view which appears in FIG. 2.)

The pins illustrated in FIG. 4 carry a number of different types of signals. (Note that FIG. 4 illustrates an exemplary DDR3 pin out for an x8 DRAM.) A first group of pins carry data signals, such as DQ0-DQ7, which as mentioned above are coupled to the memory controller through a direct path. A second group of pins carry various data-related signals (e.g., strobes), such as DQS, DQS#, DM/TDQS and NU/TDQS. A third group of pins carry various address/command signals, such as RAS#, CAS#, WE#, BA0-BA2, A0-A13, AP and BC#. A fourth group of pins carry clock signals, such as CK and CK#. A fifth group of pins carry various per-rank control signals, such as ODT, CS# and CKE. A sixth group of pins carry power-related signals, such as VSS, VDD, VDDQ and VSSQ. Finally, a seventh group of pins carry miscellaneous non-power signals, such as ZQ, VREFCA and RESET#.

Note that address and data signals can be paired between opposing chips as is illustrated by the curved dashed lines connecting DQ4 to DQ7 and A2 to A1 in FIG. 4. When these opposing chips are mounted on a circuit board, the pins from opposite sides of the line of symmetry are located over each other. This allows the pins to be easily coupled together through a via in the circuit board, wherein the via is electrically coupled to a corresponding signal line in either the fly-by path or the direct path. The paired address and data pins are "functionally equivalent" in the first and second memory packages. This means that the pins can be permuted differently for each memory package without affecting operation of the memory system. Note that address pins as well as data pins can be permuted differently for each memory chip without affecting how the memory system operates. For example, if address pins are permuted, a given address pattern will always reference the same memory location, so the memory will continue to operate in the same manner. Similarly, if data pins are permuted, data bits may be stored at different locations in a memory device, but when the data bits are read out through the permuted pins, they will be restored to their original order.

Moreover, in this example a number of clock and strobe signals, such as DQS, DQS#, CK and CK#, are located near the respective centers of associated pairs of opposing memory packages. This is done to reduce associated stub lengths within the memory packages and to thereby improve system performance. At the same time, other less time-critical signals (such as VSS, VDD, VSSQ and VDDQ), or per-rank signals (such as ODT and CS#) which are not paired with corresponding signals in the opposing chip, are pushed away from the central location and toward the edge of the chip.

In an alternative embodiment (not shown), opposing memory packages are configured to have a partially mirrored pin configuration, wherein some opposing "mirrored" pins in the first and second memory packages are configured to carry the same signals for each chip. This enables these mirrored pins to be coupled together through vias in the circuit board, wherein the vias can be electrically coupled to corresponding signal lines in either the fly-by path or the direct path. Note that the mirrored mode can be activated for a memory chip by writing to a control register 522 in the memory chip 552, or alternatively by setting appropriate voltages on special mirror-mode configuration pins on the memory chip.

Figure 5A:
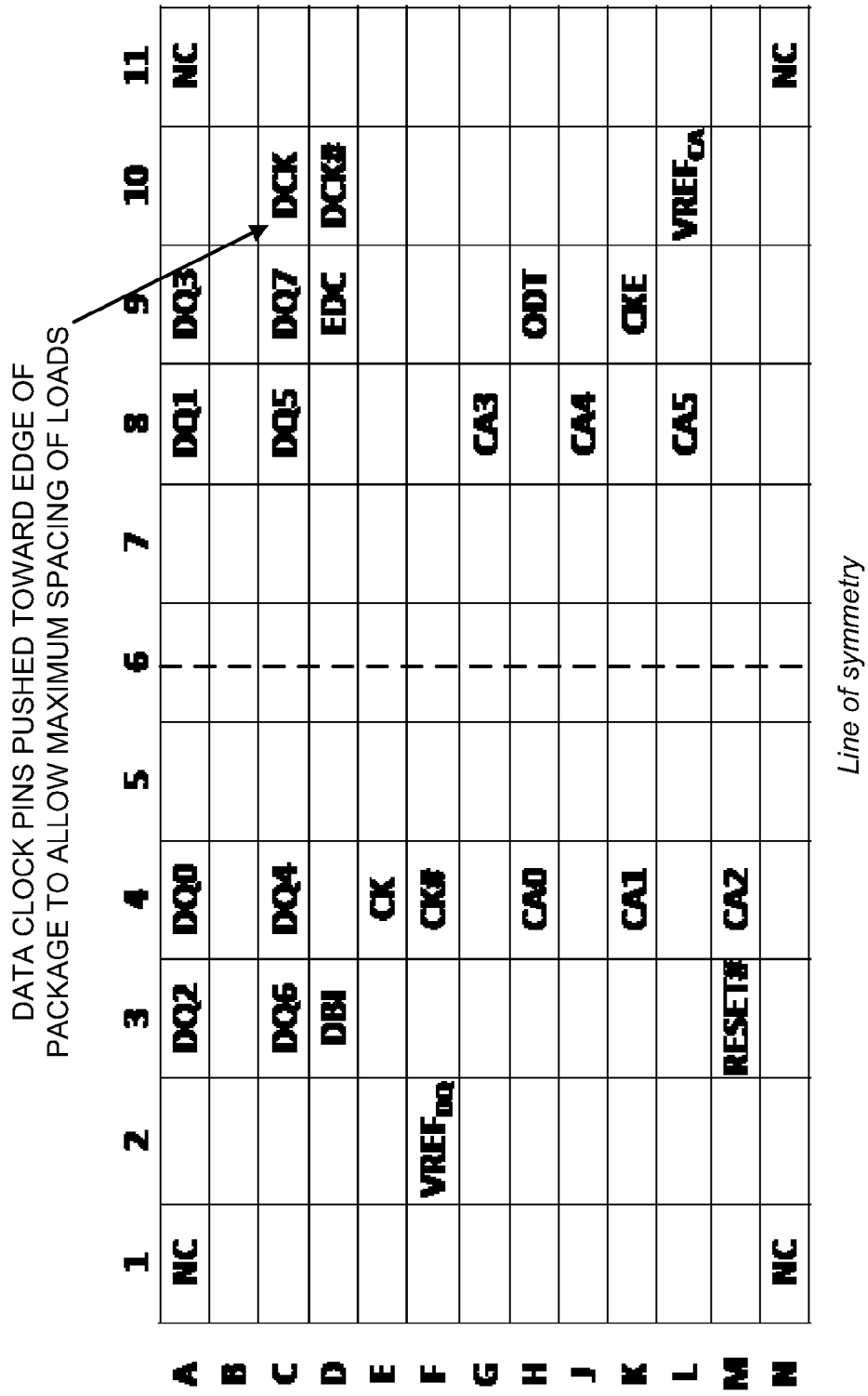
FIG. 5A illustrates another exemplary pin layout for a memory package in accordance with the disclosed embodiments.

FIG. 5A illustrates another exemplary pin layout for a memory package in accordance with the disclosed embodiments. Similar to the layout illustrated in FIG. 4, in the layout illustrated in FIG. 5A, the pins carry a number of different types of signals. A first group of pins carry data signals, such as DQ0-DQ7. A second group of pins carry various data-related signals (e.g., strobes), such as EDC and DBI. A third group of pins carry various command/address signals, such as CA0-CA5. A fourth group of pins carry clock signals, such as DCLK, DCLK#, CK and CK#. A fifth group of pins carry various per-rank control signals, such as ODT, CS# and CKE. A sixth group of pins carry power-related signals (not shown). Finally, a seventh group of pins carry miscellaneous non-power signals, such as $VREF_{CA}$, $VREF_{DQ}$ and RESET#.

Note that the command/address signals CA0-CA5 are located close to the center of the memory chip to minimize associated stub and trace lengths.

Also note that that data pins DQ0-DQ1 and DQ4-DQ5 are mirrored across the line of symmetry. When the opposing packages are mounted on the circuit board, the mirrored pins from opposite sides of the line of symmetry are located over each other. This allows the pins to be easily coupled together through a via in the circuit board, wherein the via is electrically coupled to a corresponding signal line in either the fly-by path or the direct path. Note that coupling the signal lines in this way permutes the data pins. However, permuting the data pins between the mirrored chips in this way does not affect how the memory system operates.

In the embodiment illustrated in FIG. 5A, some pins carrying high-speed signals, such as DCLK and DCLK#, are pushed toward the edge of the chip package in order to space their loads apart on an associated signal line in the fly-by path. By doing this, the corresponding signals from opposing memory packages are coupled to the given signal line at different locations which are separated by a distance $d_1$. As mentioned above, the distance $d_1$ is ideally half of a spacing $d_2$ between successive pairs of opposing memory packages along the signal line. In this way, the coupling locations and associated loads for individual memory packages are distributed along the signal line.

Figure 5B:
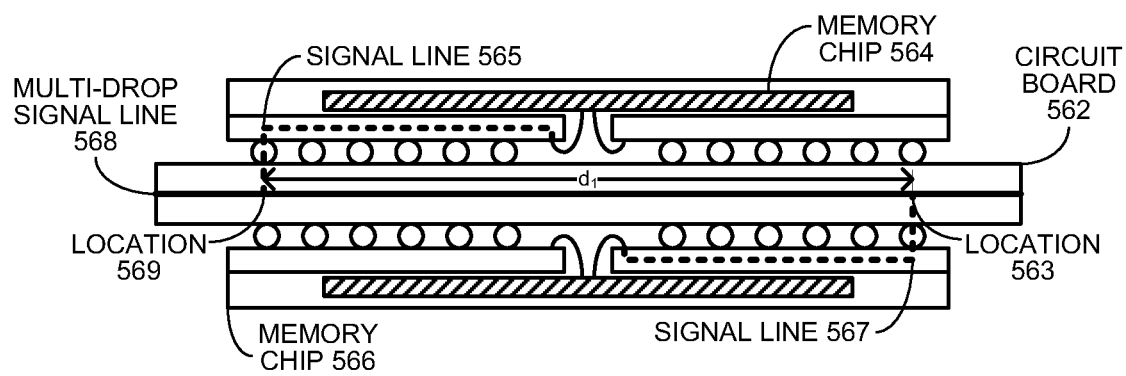
FIG. 5B illustrates how corresponding signal lines from opposing chips connect to a multi-drop signal line in a circuit board in accordance with the disclosed embodiments.

More specifically, FIG. 5B illustrates how corresponding signal lines from opposing chips connect to a multi-drop signal line 562 within a circuit board 562 in accordance with the disclosed embodiments. More specifically, a signal line 565 from memory chip 564 connects to multi-drop signal line 568 and a first location 569. At the same time, a corresponding signal line 567 from memory chip 566 connects to multi-drop signal line 568 at a second location 563. Note that the first location 569 and the second location 563 are separated by a distance $d_1$ along multi-drop signal line 568.

Process of Accessing a Memory

Figure 6:
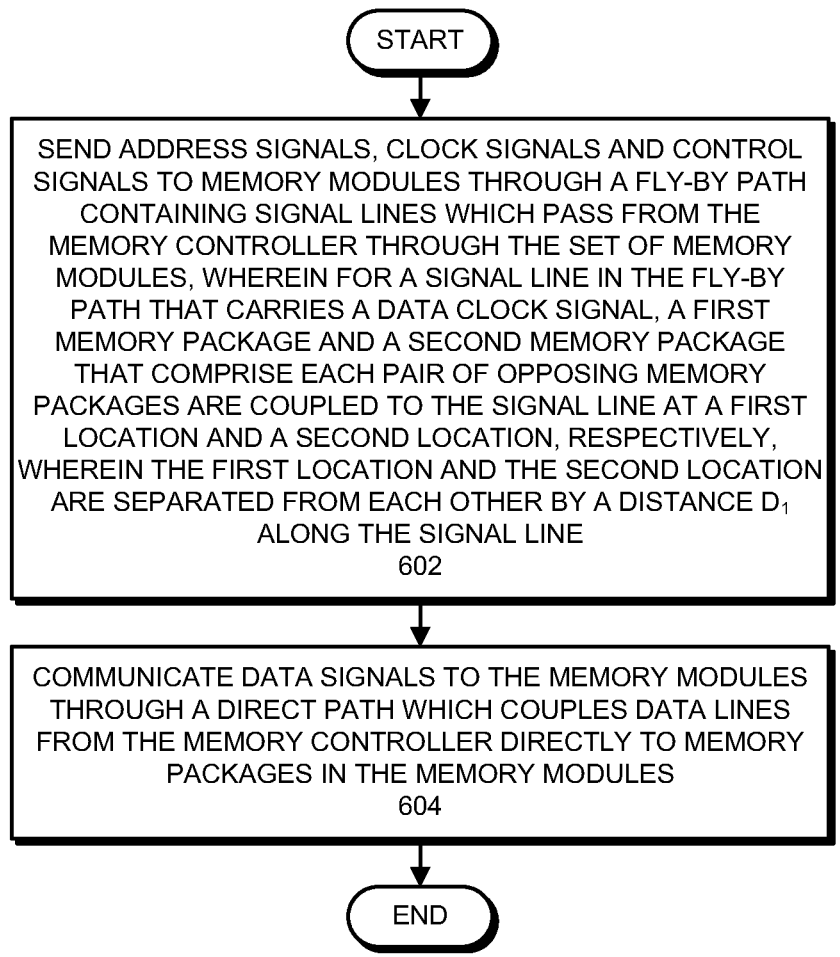
FIG. 6 presents a flowchart illustrating the process of accessing a memory in accordance with the disclosed embodiments.

FIG. 6 presents a flowchart illustrating the process of accessing a memory system in accordance with the disclosed embodiments. First, during a memory reference, the memory controller sends address signals, clock signals and control signals to the memory modules through a fly-by path between the memory controller to the set of memory modules. During this process, a signal line in the fly-by path carries a high-speed signal (such as a data clock signal) through opposing pairs of memory packages, wherein the memory packages in each pair of memory packages are coupled to the signal line at different locations. Moreover, the different locations are separated from each other by a distance $d_1$ along the signal line (step 602). In one embodiment, the distance $d_1$ is substantially half of a spacing $d_2$ between successive pairs of opposing memory packages along the given signal line, whereby the resulting coupling locations and associated loads for memory packages are distributed along the given signal line.

While the signals are being communicated through the fly-by path, the memory controller communicates data signals to the memory modules through a direct path, which couples data lines from the memory controller directly to memory packages in the memory modules (step 604).

Performance

Figure 7:
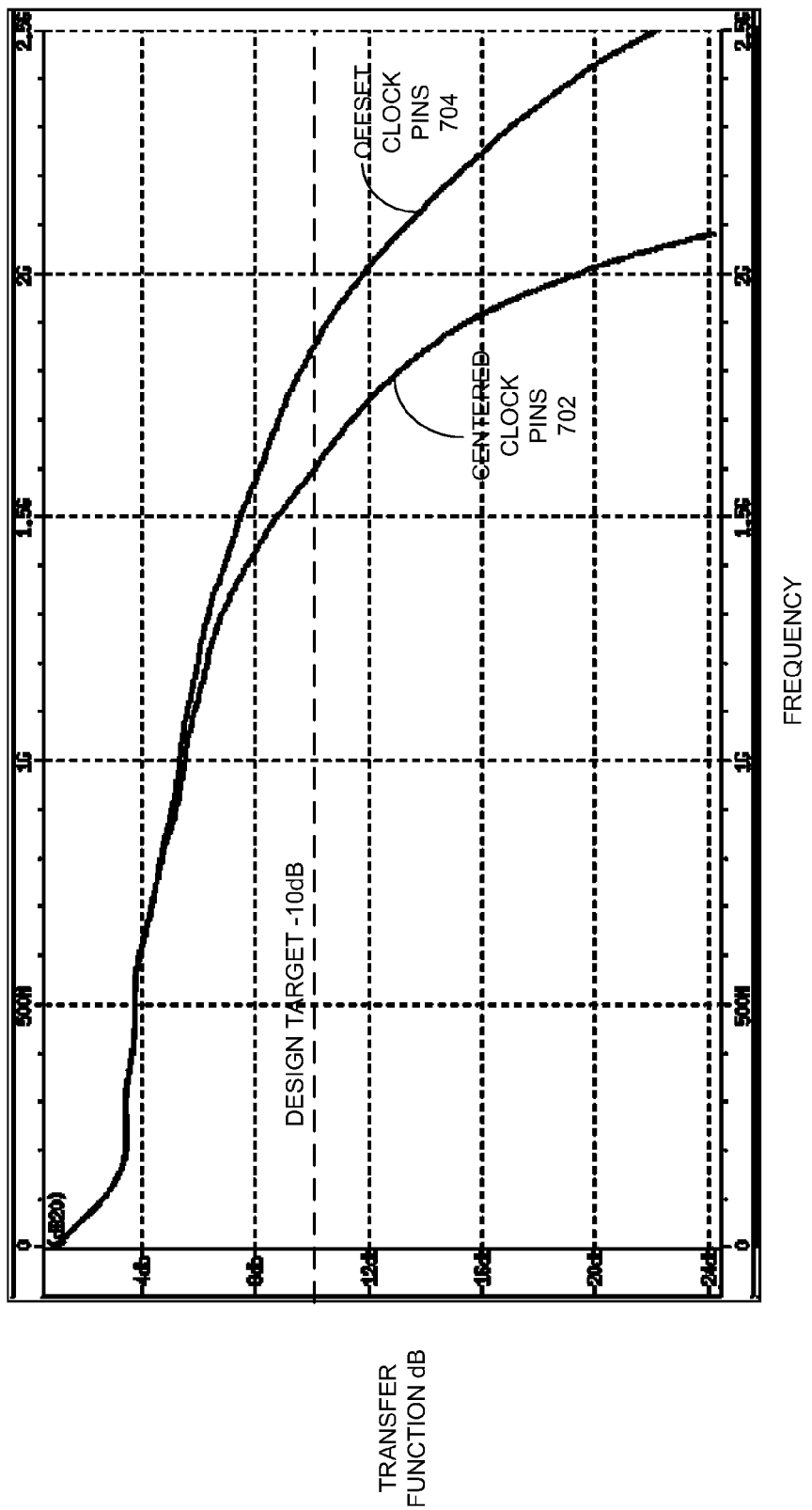
FIG. 7 presents a graph illustrating performance gained by offsetting clock pins in accordance with the disclosed embodiments.

FIG. 7 presents a graph illustrating simulation results which indicate the performance gained by using offset clock pins in accordance with the disclosed embodiments. The graph in FIG. 7 presents a transfer function (in dB) for a fly-by signal line with centered clock pins 702, and also for a fly-by signal line with offset clock pins 704. Moreover, the dashed horizontal line in the graph illustrates a "design target" of −10 dB. Note that using offset clock pins increases the transfer function by about 2 dB. This translates into an increase in clock speed from 1.57 GHz to 1.86 GHz at the design target of −10 dB. Also note that the performance gained by offsetting the clock pins and spreading out the load exceeds the performance lost due to the increased via loading (two vias versus one via for each pair of clamshell packages.)

Moreover, the above-described clock signal can be one of a number of "quadrature" clock signals that operate at a fraction of the aggregate frequency of the memory system. For example, if the memory system operates at a data rate of 8.0 Gbps, a corresponding quadrature clock signal can operate at a slower 2.0 GHz frequency (instead of a 4.0 GHz frequency).

Furthermore, as memory speeds continue to increase, it will become advantageous to similarly spread out the load for other slower, non-clock-related signals, such as other command and address signals in the fly-by path.

Figure 8A:
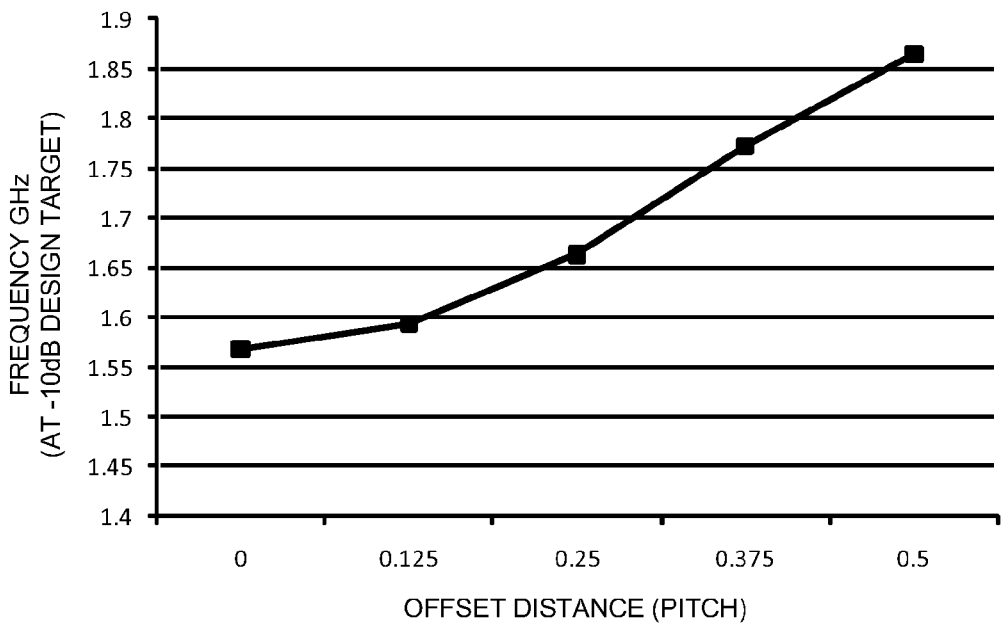
FIG. 8A presents a graph illustrating frequency at a −10 dB design target as a function of clock pin offset distance in accordance with the disclosed embodiments.

FIG. 8A presents a graph illustrating performance (expressed as frequency at the −10 dB design target) as a function of clock pin offset distance in accordance with the disclosed embodiments. Note that the clock pin offset distance is expressed in units of pitch, which involves dividing $d_1$ by $d_2$. Hence, an offset distance of 1.0 indicates that $d_1=d_2$, and an offset distance of 0 indicates that signal lines from a pair opposing memory chips intersect the fly-by signal line at the same place. Moreover, when the offset distance equals 0.5 the intersections (and hence the associated loads) from the pair of opposing memory chips and adjacent pairs of chips are maximally distributed. Note that as the offset distance grows larger than 0.5, a clock line intersection from a first pair of memory modules becomes closer to a clock line intersection from a successive second pair of memory modules, until the clock line intersections from the first and second pairs of memory modules eventually touch when the offset distance equals 1.0. Note that as the offset distance increases from 0 to 0.5, the frequency at the design target of −10 dB increases by about 1.9 dB.

Figure 8B:
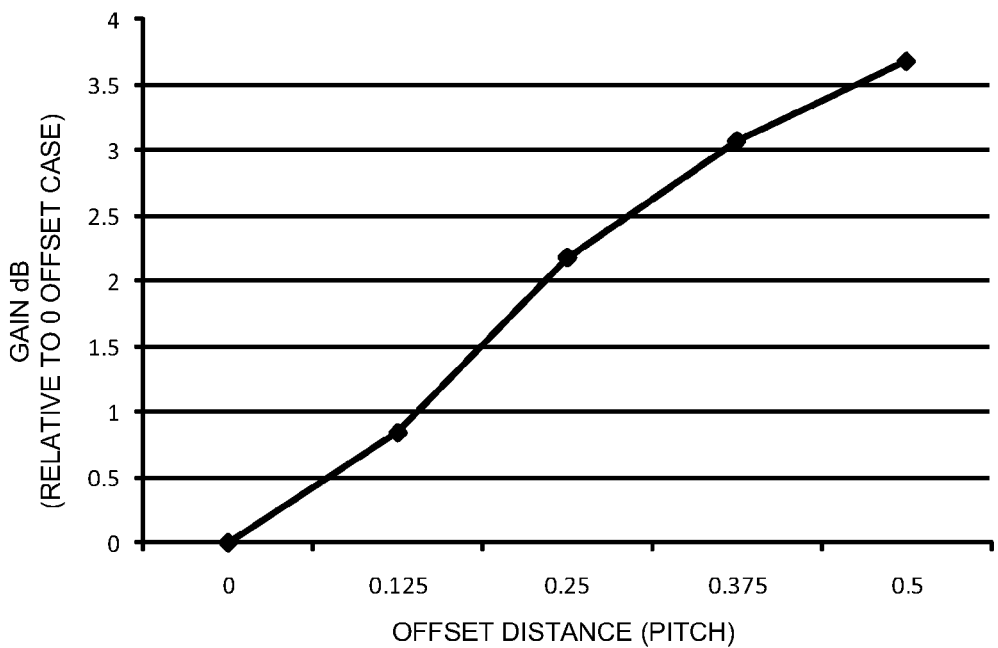
FIG. 8B presents a graph illustrating gain in comparison to the zero offset case as a function of clock pin offset distance in accordance with the disclosed embodiments.

FIG. 8B presents a graph illustrating gain in comparison to the zero offset case as a function of clock pin offset distance in accordance with the disclosed embodiments. As indicated in this graph, an offset of 0.125 in pitch, produces a gain of 0.84 dB, an offset of 0.25 in pitch produces a gain of 2.18 dB, an offset of 0.375 in pitch produces a gain of 3.07 dB, and finally, an offset of 0.50 in pitch produces a gain of 3.68 dB.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

What is claimed is:

1. A memory system, comprising:
a circuit board having one or more pairs of opposing memory chips which are located on opposite sides of the circuit board in a clamshell configuration and including a first memory chip disposed opposite a second memory chip;
a multi-drop path including a timing signal line coupled to each memory chip; and
wherein the first memory chip is coupled to the timing signal line at a first location and the second memory chip is coupled to the timing signal line at second location, wherein the first location and the second location are separated from each other by a distance $d_1$ along the signal line, wherein the distance $d_1$ is at least half of a spacing $d_2$ between like edges of successive pairs of opposing memory chips along the timing signal line, whereby coupling locations and associated loads for individual memory chips are distributed along the timing signal line.

2. The memory system of claim 1,
wherein the first and second memory chips are contained within a first and a second memory package, respectively; and
wherein for another signal line in the multi-drop path, the first and second memory chips in each pair of opposing memory chips are coupled to the other signal line at the same shared location.

3. A memory module, comprising:
a circuit board having one or more pairs of opposing memory chips which are located on opposite sides of the circuit board in a clamshell configuration and including a first memory chip disposed opposite a second memory chip;
wherein the circuit board is configured to support a multi-drop path for a timing signal line that is coupled to each memory chip; and
wherein the first memory chip is coupled to the timing signal line at a first location and the second memory chip is coupled to the timing signal line at a second location, wherein the first location and the second location are separated from each other by a distance $d_1$ along the timing signal line, wherein the distance $d_1$ is at least half of a spacing $d_2$ between like edges of successive pairs of opposing memory chips along the timing signal line, whereby coupling locations and associated loads for individual memory chips are distributed along the timing signal line.

4. The memory module of claim 3, wherein the spacing between the first and second locations is facilitated by locating associated pins on a first and a second memory package for the first and second memory chips in opposite directions from respective centers of the first and second memory packages.

5. The memory module of claim 3,
wherein the first and second memory chips are contained within a first and a second memory package, respectively; and
wherein for another signal line in the multi-drop path, the first and second memory packages in each pair of opposing memory packages are coupled to the other signal line at the same shared location.

6. The memory module of claim 5,
wherein the shared location is proximate to respective centers of the first and second memory packages when the first and second memory packages are mounted on opposite sides of the circuit board; and
wherein associated pins on the first and second memory packages are located in proximity to respective centers of the first and second memory packages to reduce associated stub lengths and trace lengths within the first and second memory packages and within the circuit board.

7. The memory module of claim 5,
wherein the first and second memory packages are configured to have a partially mirrored pin configuration wherein some opposing pins in the first and second memory packages are associated with the same signal; and
wherein the other signal line in the multi-drop path is coupled to opposing pins associated with the same signal in the first and second memory packages.

8. The memory module of claim 5,
wherein the other signal line in the multi-drop path is coupled to functionally equivalent pins in the first and second memory packages, wherein the functionally equivalent pins can be permuted differently for each memory package without affecting operation of the memory system; and
wherein the other signal line in the multi-drop path is coupled to functionally equivalent opposing pins in the first and second memory packages.

9. The memory module of claim 3,
wherein the multi-drop path is a fly-by path; and
wherein the memory system further comprises a direct path which couples data lines directly to memory chips on the circuit board.

10. The memory module of claim 3, wherein the timing signal line is a clock line.

11. A method for accessing a memory, comprising:
directing memory accesses that arise during execution of a program by a processor to at least one circuit board having one or more pairs of opposing memory chips which are located on opposite sides of the circuit board in a clamshell configuration and including a first memory chip disposed opposite a second memory chip;
wherein directing the memory access involves sending address signals, clock signals and control signals to the circuit board through a multi-drop path containing a timing signal line that is coupled to each memory chip; and wherein the first memory chip is coupled to the timing signal line at a first location and the second memory chip is coupled to the timing signal line at a second location, wherein the first location and the second location are separated from each other by a distance $d_1$ along the timing signal line, wherein the distance $d_1$ is at least half of a spacing $d_2$ between like edges of successive pairs of opposing memory chips along the timing signal line, whereby coupling locations and associated loads for individual memory chips are distributed along the timing signal line.

12. The method of claim 11, wherein directing the memory access also involves communicating data signals through a direct path which couples data lines from the memory controller directly to memory chips on the circuit board.

13. A chip package, comprising:

I/O pins coupled to a semiconductor chip located within the chip package, wherein the I/O pins include a first set of I/O pins and a second set of I/O pins;

wherein the first set of I/O pins are located in proximity to an axis of symmetry of the chip package to reduce associated stub lengths and trace lengths within the chip package and within a circuit board when the chip package is mounted in a clamshell configuration, wherein an opposing chip package is mounted on an opposite side of the circuit board from the chip package; and wherein the second set of I/O pins are located away from the axis of symmetry, so that when the chip package is mounted in the clamshell configuration, an I/O timing pin in the second set of I/O pins is coupled to a multi-drop timing signal line in the circuit board at a first location and a corresponding I/O timing pin on the opposing chip package which carries the same signal is coupled to the multi-drop timing signal line at a second location, wherein the first location and the second location are separated from each other by a distance $d_1$ along the timing signal line, wherein the distance $d_1$ is at least half of a spacing $d_2$ between like edges of successive pairs of opposing chip packages along the timing signal line, whereby coupling locations and associated loads for individual chip packages are distributed along the timing signal line.

* * * * *